US012677544B2

(12) United States Patent
Lee

(10) Patent No.: US 12,677,544 B2
(45) Date of Patent: Jul. 7, 2026

(54) DISPLAY DEVICE

(71) Applicant: Samsung Display Co., LTD., Yongin-si (KR)

(72) Inventor: Sungeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 395 days.

(21) Appl. No.: 18/319,782

(22) Filed: May 18, 2023

(65) Prior Publication Data

US 2024/0138205 A1    Apr. 25, 2024

US 2024/0237426 A9    Jul. 11, 2024

(30) Foreign Application Priority Data

Oct. 25, 2022    (KR) ......................... 10-2022-0138739

(51) Int. Cl.
*H10K 59/123*        (2023.01)
(52) U.S. Cl.
CPC .................................. *H10K 59/123* (2023.02)
(58) Field of Classification Search
None
See application file for complete search history.

(56) References Cited

U.S. PATENT DOCUMENTS

| | | | |
|---|---|---|---|
| 2015/0115252 A1 | 4/2015 | Yeo et al. | |
| 2023/0055596 A1* | 2/2023 | Zhang ....................... | G09F 9/33 |
| 2023/0200146 A1* | 6/2023 | Kim ................. | H10K 59/80515 |
| | | | 257/40 |
| 2025/0063900 A1* | 2/2025 | Li ......................... | H10K 59/122 |

FOREIGN PATENT DOCUMENTS

| | | |
|---|---|---|
| CN | 109256413 A | 1/2019 |
| CN | 109524561 A | 3/2019 |
| KR | 1020150010844 A | 1/2015 |
| KR | 20150047743 A | 5/2015 |

OTHER PUBLICATIONS

Depth profiling of thin IT0 films by grazing incidence X-ray diffraction; 1996.*
Unveiling the annealing dependent mechanical properties of free-standing indium-tin-oxide thin films, 2021.*
Korean Office Action for Korean Patent Application No. 10-2022-0138739 dated Apr. 9, 2026.

* cited by examiner

*Primary Examiner* — Nilufa Rahim
(74) *Attorney, Agent, or Firm* — CANTOR COLBURN LLP

(57) ABSTRACT
A display device includes an active layer, a gate electrode on the active layer, a conductive layer on the gate electrode and connected to the active layer, a pixel electrode which is on the conductive layer and connected to the conductive layer, and a connection electrode which connects the conductive layer connected to the active layer, to the pixel electrode. The connection electrode which connects the conductive layer connected to the active layer, to the pixel electrode, has a tensile strength less than or equal to a tensile strength of the active layer.

20 Claims, 11 Drawing Sheets

DISPLAY DEVICE

This application claims priority to Korean Patent Application No. 10-2022-0138739 filed on Oct. 25, 2022, and all the benefits accruing therefrom under 35 U.S.C. § 119, the entire disclosure of which is incorporated herein by reference.

BACKGROUND

1. Field

The present disclosure relates to a display device, and more particularly, to a flexible display device.

2. Description of the Related Art

A display device refers to a device that displays an image for providing visual information to a user. An organic light emitting diode (OLED) display has been spotlighted among display devices.

Since the organic light emitting diode display has a self-emission characteristic and does not require a separate light source, unlike a liquid crystal display device, a thickness and a weight of the organic light emitting diode display can be reduced. Further, the organic light emitting diode display has high quality characteristics such as low power consumption, high luminance, and high response speed.

SUMMARY

A display device may include one or more component which is flexible, such as including plastic. Point defects may occur in the display device due to external impact. When some transistors of the display device are damaged by the external impact, an electrical driving current may be continuously applied to a driving transistor, and thus a bright spot defect may be visually recognized in the display device.

An object of the present disclosure is to provide a display device configured to prevent deterioration of display quality due to external impact.

However, the object of the present disclosure is not limited to the above-described object, and may be variously extended without departing from the idea and scope of the present disclosure.

In order to achieve the above object, a display device according to the embodiments may include a substrate, an active layer disposed on the substrate, a gate electrode disposed on the active layer, a conductive layer disposed on the gate electrode and connected to the active layer, a connection electrode disposed on the conductive layer, connected to the conductive layer, and having a tensile strength less than or equal to a tensile strength of the active layer, and a pixel electrode disposed on the connection electrode and connected to the connection electrode.

In one embodiment, the active layer may include at least one selected from a silicon semiconductor, an oxide semiconductor, and an organic semiconductor.

In one embodiment, the tensile strength of the connection electrode may be about 400 megapascals (MPa) or less.

In one embodiment, an elastic modulus of the connection electrode may be greater than or equal to an elastic modulus of the active layer.

In one embodiment, the modulus of elasticity of the connection electrode may be about 50 gigapascals (GPa) or more.

In one embodiment, the tensile strength of the connection electrode may be less than or equal to the tensile strength of the gate electrode.

In one embodiment, the tensile strength of the connection electrode may be less than or equal to the tensile strength of the conductive layer.

In one embodiment, the connection electrode may include a transparent conductive oxide (TCO).

The transparent conductive oxide may be at least one selected from indium tin oxide (ITO), indium zinc oxide (IZO), indium gallium zinc oxide (IGZO), zinc oxide (ZnO), aluminum zinc oxide (AZO), and indium oxide (In2O3).

In one embodiment, the substrate may include polyimide.

In one embodiment, the display device may further include a transistor including the active layer, the gate electrode, and the conductive layer.

In one embodiment, the display device may further include a light emitting structure as a light emitting element including the pixel electrode.

In one embodiment, the light emitting structure may further include a light emitting layer disposed on the pixel electrode and a common electrode which is disposed on the light emitting layer.

In order to achieve the above object, the display device according to the embodiments may include a substrate, an active layer disposed on the substrate, a gate electrode disposed on the active layer, a conductive layer disposed on the gate electrode and connected to the active layer, a connection electrode disposed on the conductive layer, connected to the conductive layer, and having an elastic modulus greater than or equal to an elastic modulus of the active layer, and a pixel electrode disposed on the connection electrode and connected to the connection electrode.

In one embodiment, the active layer may include at least one selected from a silicon semiconductor, an oxide semiconductor, and an organic semiconductor.

In one embodiment, the modulus of elasticity of the connection electrode may be about 50 GPa or more.

In one embodiment, the tensile strength of the connection electrode may be less than or equal to the tensile strength of the active layer.

In one embodiment, the tensile strength of the connection electrode may be about 400 MPa or less.

In one embodiment, the modulus of elasticity of the connection electrode may be greater than or equal to the modulus of elasticity of the gate electrode.

In one embodiment, the modulus of elasticity of the connection electrode may be greater than or equal to the modulus of elasticity of the conductive layer.

In the display device according to the embodiments, the connection electrode has the tensile strength less than or equal to the tensile strength of the active layer, or has the elastic modulus greater than or equal to the elastic modulus of the active layer, such that the connection electrode may have brittleness greater than brittleness of the active layer.

When the display device includes a connection electrode having high brittleness, the connection electrode connecting the drain electrode and the pixel electrode may be damaged simultaneously with the active layer or earlier than the active layer. In other words, when the connection electrode is damaged, a driving current (or an initialization voltage) may not be transmitted from the drain electrode to the pixel electrode. Therefore, even when the transistor is damaged by external impact, a dark spot instead of a bright spot, may occur in the display device. Since the bright spot of the display device is more visually recognized from outside a display device such as by the user's eyes than the dark spot, deterioration of display quality caused by the external impact due to the connection electrode can be prevented.

However, the advantageous effects of the present disclosure are not limited to the above-described effects, and may be variously extended without departing from the idea and scope of the present disclosure.

DETAILED DESCRIPTION

Figure 1:
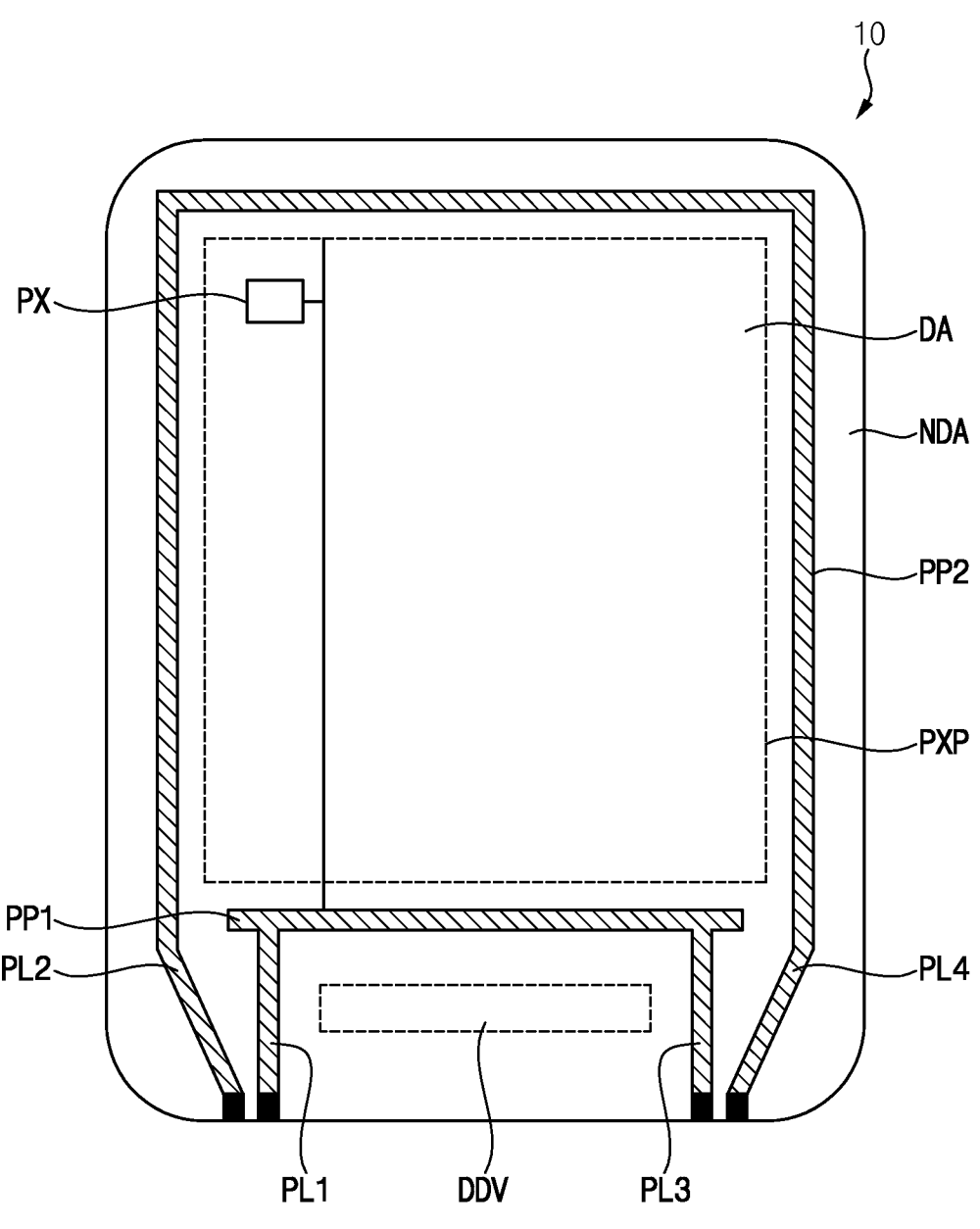
FIG. 1 is a plan view showing a display device according to an embodiment of the present disclosure.

Hereinafter, the embodiments of the present disclosure will be described in more detail with reference to the accompanying drawings. The same reference numerals are used for the same elements in the drawings, and redundant descriptions of the same elements will be omitted.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present. As being related "directly," elements may be in contact with each other such as to form an interface therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Within the Figures and the text of the disclosure, a reference number indicating a singular form of an element may also be used to reference a plurality of the singular element.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view showing a display device 10 according to the embodiments of the present disclosure.

Referring to FIG. 1, a display device 10 according to the embodiments of the present disclosure may include a pixel unit PXP (of FIG. 2), a data driver DDV, a first power line PL1, a second power line PL2, a third power line PL3, a fourth power line PL4, a first power pattern PP1, and a second power pattern PP2.

The pixel unit PXP may include at least one pixel PX, and may receive an electrical signal such as a voltage (e.g., a power voltage and/or a data voltage) for driving the pixel PX. In addition, the pixel unit PXP may be disposed therein with a data line DL (of FIG. 2) connected to the pixel PX, a gate line GL (of FIG. 2) connected to the pixel PX, and an emission control line EML (of FIG. 2) connected to the pixel PX.

The data driver DDV may overlap with a non-display area NDA of the display device 10. In one embodiment, the non-display area NDA may be disposed adjacent to a display area DA. For example, the display area DA may have a rectangular shape, and the non-display area NDA may be disposed to surround the display area DA. In an embodiment, an image may be displayed in the display area DA, and an image may not be displayed in the non-display area NDA, without being limited thereto.

A planar shape of the display device 10 may extend along a plane defined by a first direction and a second direction crossing each other. Referring to FIG. 1, for example, the vertical direction and the horizontal direction may variously represent the first direction and the second direction. A thickness of the display device 10 and various components or layers thereof may extend along a third direction, such as to define a thickness direction. Various components and layers of the display device 10 may have a display area DA and a non-display area NDA respectively corresponding to those described above.

In one embodiment, the data driver DDV may be disposed in the non-display area NDA in the form of an integrated circuit integrated circuit (D-IC). For example, the data driver DDV may be bonded to be connected to fan-out lines disposed in the non-display area NDA, and the data voltage DATA (of FIG. 3) may be transmitted to the display area DA through the fan-out lines. However, the structure for arranging the data driver DDV is not limited thereto. For example, the data driver DDV may be separately disposed on a printed circuit board.

The data driver DDV may generate the data voltage DATA and provide the data voltage DATA to the display area DA. This will be described with reference to FIG. 2.

The first to fourth power lines PL1, PL2, PL3, and PL4 may overlap with (or correspond to) the non-display area NDA. In one embodiment, the first power line PL1 may be adjacent to the data driver DDV and disposed on a left side of the data driver DDV in the plan view. The second power line PL2 may be adjacent to the first power line PL1 and disposed on a left side of the first power line PL1. The third power line PL3 may be adjacent to the data driver DDV and disposed at a right side of the data driver DDV in the plan view. The fourth power line PL4 may be adjacent to the third power line PL3 and disposed on a right side of the third power line PL3. Accordingly, the first to fourth power lines PL1, PL2, PL3, and PL4 may be symmetrical with respect to the data driver DDV as a reference line. That is, a center of the data driver DDV may be defined along the horizontal direction in FIG. 1, the reference line may extend through the center and along the vertical direction, and the various power lines may be symmetrical with respect this reference line.

However, the number and arrangement structure of the first to fourth power lines PL1, PL2, PL3, and PL4 are not limited thereto. For example, the display device 10 may include the first and second power lines PL1 and PL2, and may not include the third and fourth power lines PL3 and PL4. In addition, all of the first to fourth power lines PL1, PL2, PL3, and PL4 may be disposed on the left (or right) side of the data driver DDV.

The first to fourth power lines PL1, PL2, PL3, and PL4 may transmit the power voltage as an electrical signal, from pads or terminals, to the display area DA. An external component may be connected to the display device 10, at the pads or terminals. For example, the pads may be connected to a flexible printed circuit board to which a power management integrated circuit (PMIC) is bonded, and may receive the power voltage from the power management integrated circuit. In one embodiment, the first power line PL1 may transmit a first power voltage ELVDD (of FIG. 3), the second power line PL2 may transmit a second power voltage ELVSS (of FIG. 3), the third power line PL3 may transmit the first power voltage, and the fourth power line PL4 may transmit the second power voltage.

However, the power voltage transmitted by the first to fourth power lines PL1, PL2, PL3, and PL4 is not limited thereto. For example, the first and third power lines PL1 and PL3 may transmit the second power voltage, and the second and fourth power lines PL2 and PL4 may transmit the first power voltage. In addition, the first to fourth power lines PL1, PL2, PL3, and PL4 may transmit a voltage different from the power supply voltage. For example, the first to fourth power lines PL1, PL2, PL3, and PL4 may transmit an initialization voltage (e.g., the initialization voltage VINT of FIG. 3).

The first power pattern PP1 may overlap with the non-display area NDA and disposed between the display area DA and the data driver DDV. The first power pattern PP1 may be connected to the first and third power lines PL1 and PL3. The first power pattern PP1 may receive the first power voltage from the first and third power lines PL1 and PL3, and transmit the first power voltage from the non-display area NDA to the display area DA.

The second power pattern PP2 may overlap with the non-display area NDA and extend along a boundary of the display area DA such as to surround the display area DA. The second power pattern PP2 may be connected to the second and fourth power lines PL2 and PL4. The second power pattern PP2 may receive the second power voltage from the second and fourth power lines PL2 and PL4, and transmit the second power voltage from the non-display area NDA to the display area DA. The second power pattern PP2 may have a loop shape which is open at one side of the display device 10, such as a side at which the data driver DDV is disposed.

Figure 2:
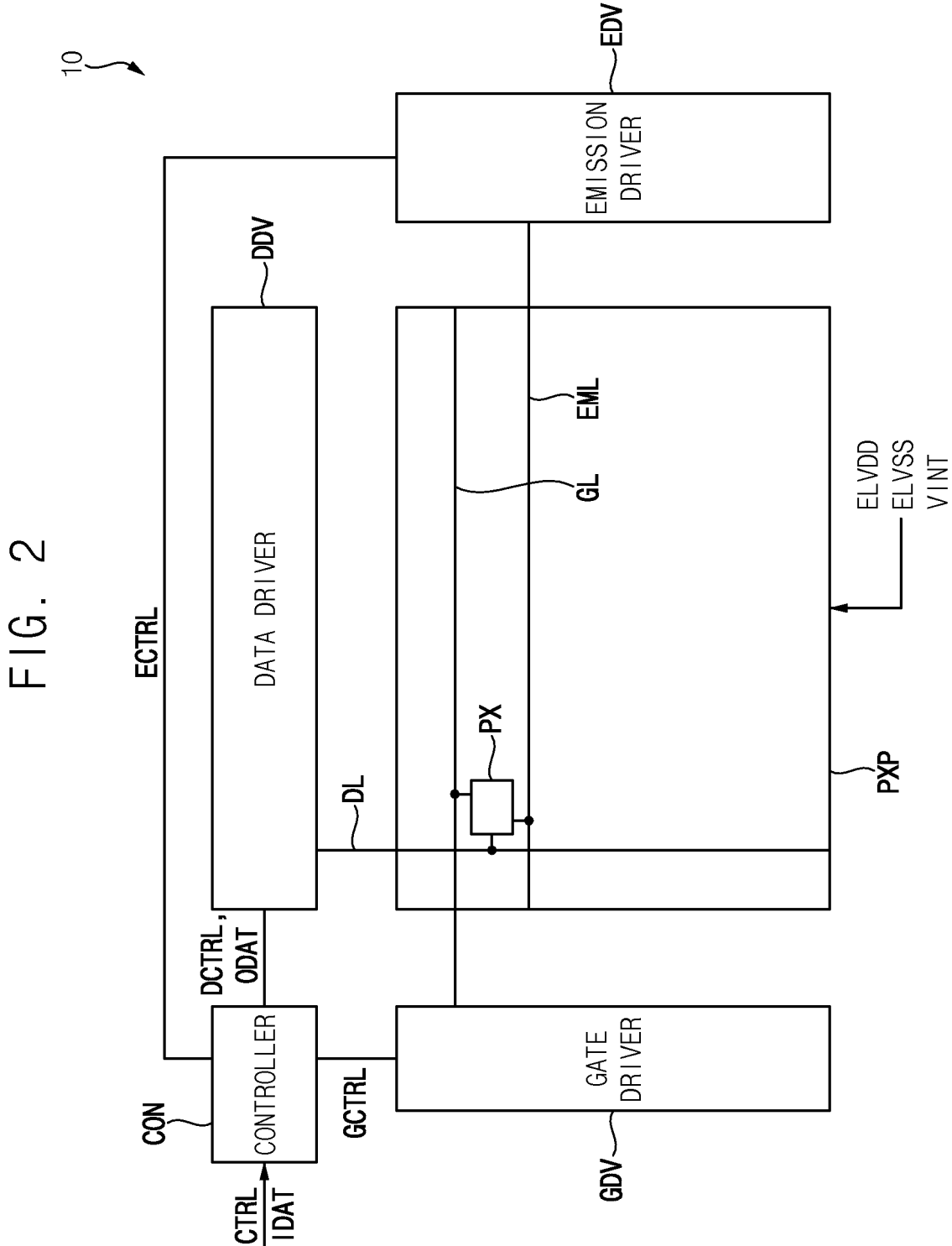
FIG. 2 is a block diagram for describing the display device of FIG. 1.

FIG. 2 is a block diagram for describing the display device 10 of FIG. 1.

Figure 3:
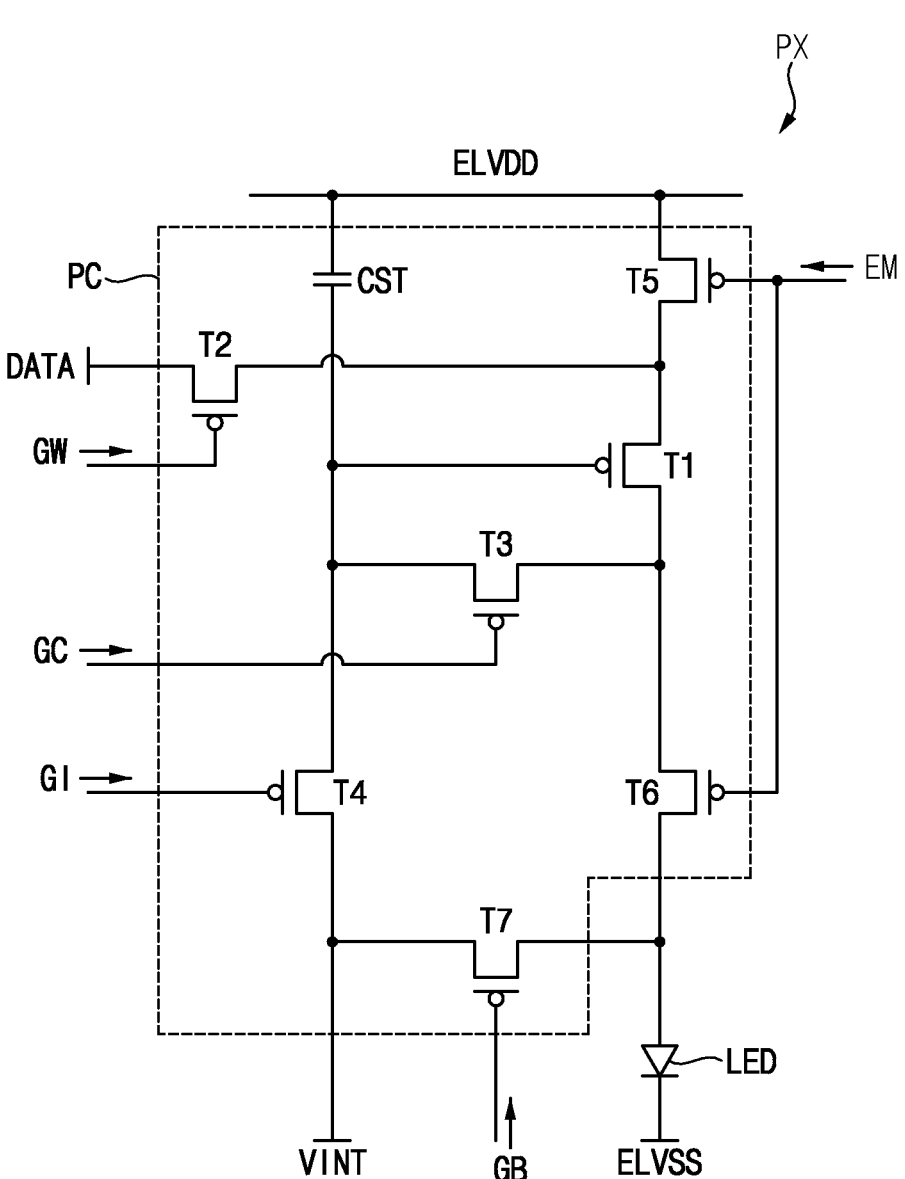
FIG. 3 is a circuit diagram for describing a pixel included in the display device of FIG. 1.

Referring to FIG. 2 and FIG. 3, the display device 10 may include a gate driver GDV, the data driver DDV, an emission driver EDV, and a controller CON as a timing controller, for driving the pixel unit PXP.

The gate driver GDV may generate gate signals GW, GC, GI and GB based on a gate control signal GCTRL. For example, the gate signals GW, GC, GI and GB may include a gate-on voltage for turning on a transistor and a gate-off voltage for turning off the transistor. The gate control signal GCTRL may include a vertical start signal, a clock signal, and the like.

The data driver DDV may generate the data voltage DATA based on output image data ODAT and a data control signal DCTRL. For example, the data driver DDV may generate the data voltage DATA corresponding to the output image data ODAT, and output the data voltage DATA in response to the data control signal DCTRL. The data control signal DCTRL may include an output data enable signal, a horizontal start signal, and a load signal.

The emission driver EDV may generate an emission control signal EM based on an emission driving signal ECTRL. For example, the emission driving signal ECTRL may include a vertical start signal, a clock signal, and the like, and the emission control signal EM may include a gate-on voltage for turning on a transistor and a gate-off voltage for turning off the transistor.

The controller CON (e.g., the timing controller T-CON) may receive input image data IDAT and a control signal CTRL from an external host processor (e.g., a GPU). For example, the input image data IDAT may be RGB data including red image data, green image data and blue image data. The control signal CTRL may include a vertical synchronization signal, a horizontal synchronization signal, an input data enable signal, a master clock signal, and the like. The controller CON may generate the gate control signal GCTRL, the emission driving signal ECTRL, the data control signal DCTRL and the output image data ODAT based on the input image data IDAT and the control signal CTRL.

FIG. 3 is a circuit diagram for describing a pixel PX included in the display device of FIG. 1.

Referring to FIG. 3, the pixel PX may include a pixel circuit PC and a light emitting element. The light emitting element may include a light emitting diode LED, however, is not limited thereto. The pixel circuit PC may provide a driving current to the light emitting diode LED, and the light emitting diode LED may generate light based on the driving current. For example, the light emitting diode LED may variously include any of a number of light emitting elements such as an organic light emitting diode, an inorganic light emitting diode, a nano light emitting diode, and the like.

The pixel circuit PC may include a first transistor T1, a second transistor T2, a third transistor T3, a fourth transistor T4, a fifth transistor T5, a sixth transistor T6, a seventh transistor T7, and a storage capacitor CST.

The light emitting diode LED may include a first terminal (e.g., an anode terminal) and a second terminal (e.g., a cathode terminal). The first terminal of the light emitting diode LED may be connected to the sixth transistor T6 and the seventh transistor T7, and the second terminal may receive the second power voltage ELVSS. The light emitting diode LED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the first power voltage ELVDD. The storage capacitor CST may maintain a voltage level of the gate terminal of the first transistor T1 while the first gate signal GW is inactivated.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be coupled to the second transistor T2 and receive the data voltage DATA. The second terminal of the first transistor T1 may be connected to the sixth transistor T6. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. The first terminal of the second transistor T2 may receive the data voltage DATA through a data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a first terminal (e.g., a source terminal), and a second terminal (e.g., a drain terminal). The gate terminal of the third transistor T3 may receive a second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is a PMOS transistor, the third transistor T3 may be turned off when the second gate signal GC has a positive voltage level, and may be turned on when the second gate signal GC has a negative voltage level.

The third transistor T3 may diode-couple the first transistor T1 while the third transistor T3 turns on in response to the second gate signal GC. Accordingly, the third transistor T3 may compensate for a threshold voltage of the first transistor T1. For example, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive a third gate signal GI. The first terminal of the fourth transistor T4 may be connected to the gate terminal of the first transistor T1. The second terminal of the fourth transistor T4 may receive the initialization voltage VINT.

The fourth transistor T4 may be turned on or off in response to the third gate signal GI. For example, when the fourth transistor T4 is a PMOS transistor, the fourth transistor T4 may be turned off when the third gate signal GI has a positive voltage level, and may be turned on when the third gate signal GI has a negative voltage level.

The initialization voltage VINT may be provided to the gate terminal of the first transistor T1 while the fourth transistor T4 is turned on by the third gate signal GI. Accordingly, the fourth transistor T4 may initialize the gate terminal of the first transistor T1 to the initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the first power voltage ELVDD. The second terminal of the fifth transistor T5 may be connected to the first transistor T1. When the fifth transistor T5 is turned on in response to the emission control signal EM, the fifth transistor T5 may provide the first power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the light emitting diode LED. When the sixth transistor T6 is turned on in response to the emission control signal EM, the sixth transistor T6 may provide the driving current to the light emitting diode LED.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may be connected to the light emitting diode LED. The second terminal of the seventh transistor T7 may receive the initialization voltage VINT.

When the seventh transistor T7 is turned on in response to the fourth gate signal GB, the seventh transistor T7 may provide the initialization voltage VINT to the light emitting diode LED. Accordingly, the seventh transistor T7 may initialize the first terminal of the light emitting diode LED to the initialization voltage VINT. For example, the seventh transistor T7 may be referred to as an anode initialization transistor.

The circuit structure of the pixel circuit PC shown in FIG. 3 is exemplary and may be variously modified.

Figure 4:
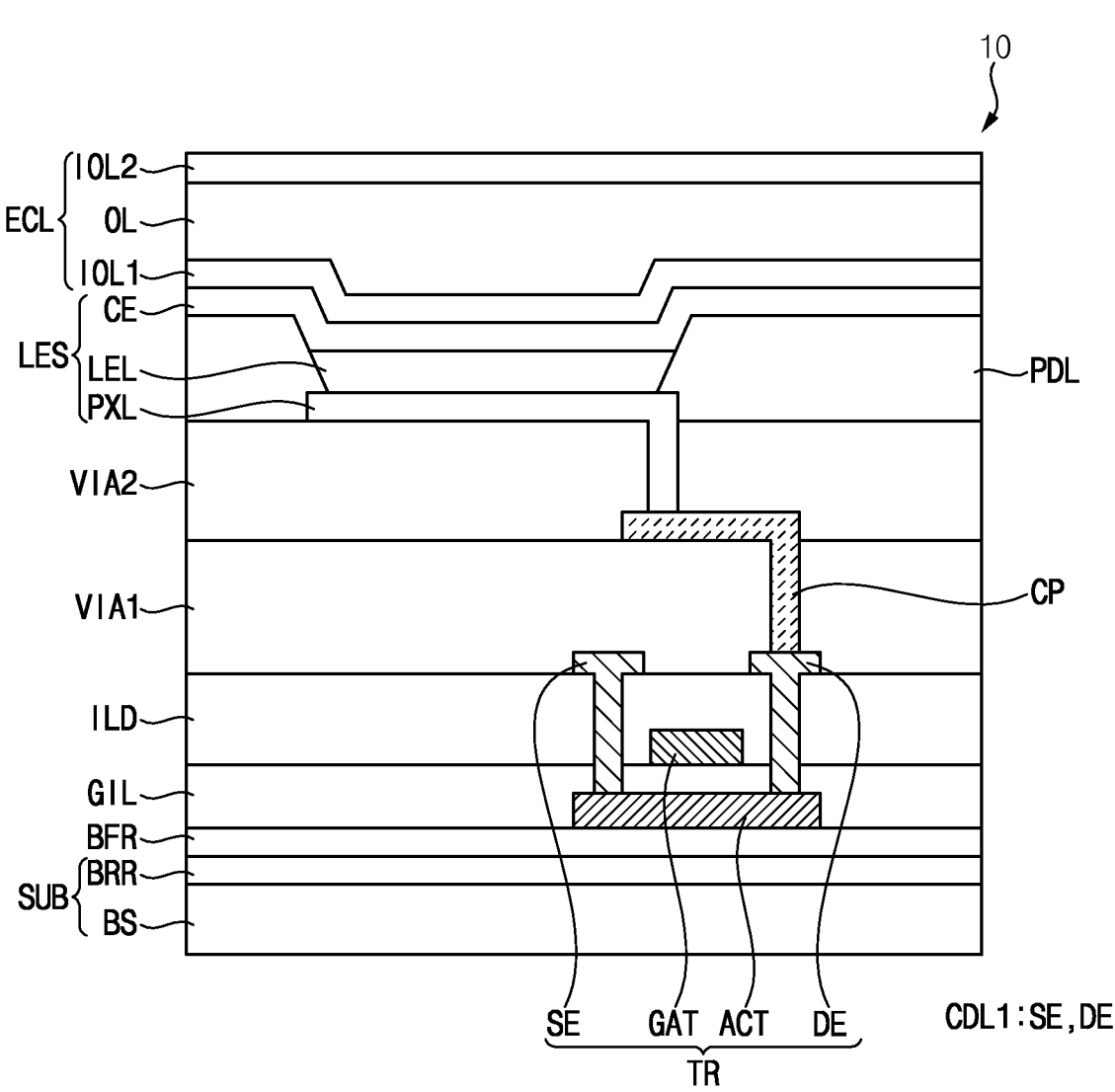
FIG. 4 is a cross-sectional view for describing a pixel unit included in the display device of FIG. 1.

FIG. 4 is a cross-sectional view for describing the pixel unit PXP included in the display device 10 of FIG. 1.

Referring to FIG. 4, the pixel unit PXP may be disposed on a substrate SUB. The pixel unit PXP may include the substrate SUB, a buffer layer BFR, an active layer ACT, a gate insulating layer GIL, a gate electrode GAT, an interlayer insulating layer ILD, a conductive layer CDL, a via insulating layer, a connection electrode CP, a pixel electrode PXL, a pixel defining layer PDL, a light emitting layer LEL, a common electrode CE, a first inorganic encapsulation layer IOL1, an organic encapsulation layer OL, and a second inorganic encapsulation layer IOL2.

The substrate SUB may include glass, quartz, plastic, and the like. In one embodiment, the substrate SUB may include plastic, and the display device 10 may have a flexible characteristic. In this case, the substrate SUB may have a structure in which at least one organic film layer and at least one barrier layer are alternately laminated.

For example, the substrate SUB may include a base substrate BS and a barrier layer BRR. The barrier layer BRR may be disposed on the base substrate BS. In this case, the base substrate BS may include an organic material such as polyimide to define a polyimide substrate. The barrier layer BRR may include an inorganic material. However, the present disclosure is not limited thereto, and the substrate SUB may include two or more base substrates and two or more barrier layers.

In another embodiment, the substrate SUB may include glass, and the display device 10 may have rigid characteristics.

The buffer layer BFR may be disposed on the substrate SUB. The buffer layer BFR may prevent metal atoms or impurities from being diffused from the substrate SUB to an active pattern of the active layer ACT. In addition, the buffer layer BFR may adjust a heat supply rate during a crystallization process for forming the active layer ACT. The buffer layer BFR may include an inorganic material.

The active layer ACT may be disposed on the buffer layer BFR. The active layer ACT may include one or more of an active pattern. In one embodiment, the active layer ACT may include at least one selected from a silicon semiconductor, an oxide semiconductor, and an organic semiconductor. For example, the silicon semiconductor may include amorphous silicon, polycrystalline silicon, and the like.

The gate insulating layer GIL may cover the active layer ACT, and may be disposed on the buffer layer BFR. The gate insulating layer GIL may include an inorganic insulating material. For example, the gate insulating layer GIL may include silicon oxide, silicon nitride, silicon oxynitride, and the like.

The gate electrode GAT as a gate pattern may be disposed on the gate insulating layer GIL. The gate electrode GAT may overlap with or correspond to the active layer ACT. The gate electrode GAT may include a metal, an alloy, a conductive metal oxide, and the like. For example, the gate electrode GAT may include silver (Ag), an alloy containing silver, molybdenum (Mo), an alloy containing molybdenum, aluminum (Al), an alloy containing aluminum, aluminum nitride (AlN), titanium (Ti), an alloy containing titanium, tungsten (W), tungsten nitride (WN), copper (Cu), nickel (Ni), chromium (Cr), chromium nitride (CrN), tantalum (Ta), platinum (Pt), scandium (Sc), and the like.

The interlayer insulating layer ILD may cover the gate electrode GAT and may be disposed on the gate insulating layer GIL. The interlayer insulating layer ILD may include an inorganic insulating material. For example, the interlayer insulating layer ILD may include silicon oxide, silicon nitride, silicon oxynitride, and the like.

The conductive layer CDL shown in FIG. 4 as the first conductive layer CDL1 may be disposed on the interlayer insulating layer ILD. The conductive layer CDL may include a plurality of conductive patterns such as a source electrode SE and a drain electrode DE. In one embodiment, the source electrode SE and the drain electrode DE may be connected to the active layer ACT. The source electrode SE may transmit the electrical driving current (or the initialization voltage VINT) to the active layer ACT, and the drain electrode DE may transmit the electrical driving current (or the initialization voltage VINT) to the pixel electrode PXL. Each of the source electrode SE and the drain electrode DE may include a metal, an alloy, a conductive metal oxide, a transparent conductive material, and the like. The source electrode SE and the drain electrode DE may be in a same layer as each other, without being limited thereto. As being in a same layer, elements may be formed in a same process and/or include a same material as each other, elements may be respective portions or respective patterns of a same material layer, elements may be on a same layer by forming an interface with a same underlying or overlying layer, etc., without being limited thereto.

The source electrode SE and the drain electrode DE, the active layer ACT, the gate electrode GAT, and the conductive layer CDL may together constitute a transistor TR. The transistor TR may correspond to the sixth transistor T6 described with reference to FIG. 3.

The via insulating layer may be disposed on the conductive layer CDL. The via insulating layer may include one or more of a first via insulating layer VIAL and a second via insulating layer VIA2. The first via insulating layer VIAL may cover the source electrode SE and the drain electrode DE, and may be disposed on the interlayer insulating layer ILD.

The connection electrode CP may be disposed on the first via insulating layer VIA1. The connection electrode CP may be connected to the drain electrode DE included in the conductive layer CDL. The connection electrode CP may receive the driving current (or the initialization voltage VINT) from the drain electrode DE.

In one embodiment, the connection electrode CP may include a metal, an alloy, and the like. For example, the connection electrode CP may include a transparent conductive oxide (TCO). The transparent conductive oxide may be at least one selected from indium tin oxide (ITO), indium zinc oxide (IZO), indium gallium zinc oxide (IGZO), zinc oxide (ZnO), aluminum zinc oxide (AZO), and indium oxide (In2O3). The above materials may be used alone or in combination.

In one embodiment, the tensile strength of the connection electrode CP may be less than or equal to the tensile strength of the active layer ACT. In other words, the connection electrode CP may include a material having a tensile strength less than or equal to that of a material included in the active layer ACT. In addition, the tensile strength of the connection electrode CP may be less than or equal to the tensile strength of the gate electrode GAT, and may be less than or equal to the tensile strength of the conductive layer CDL. In an embodiment, the tensile strength of the connection electrode CP may be less than or equal to the tensile strength of one or both of a plurality of conductive layers among the first conductive layer CDL1 and the second conductive layer CDL2. For example, the tensile strength of the connection electrode CP may be about 400 megapascals (MPa) or less.

Further, in another embodiment, the elastic modulus of the connection electrode CP may be greater than or equal to that of the active layer ACT. In other words, the connection electrode CP may include a material having an elastic modulus greater than or equal to that of the material included in the active layer ACT. In addition, the elastic modulus of the connection electrode CP may be greater than or equal to the elastic modulus of the gate electrode GAT, and may be greater than or equal to the elastic modulus of the conductive layer CDL. For example, the elastic modulus of the connection electrode CP may be about 50 gigapascals (GPa) or more.

In one embodiment, the tensile strength of the connection electrode CP may be less than or equal to the tensile strength of the active layer ACT, and the elastic modulus of the connection electrode CP may be greater than or equal to the elastic modulus of the active layer ACT. In other words, the connection electrode CP may satisfy both of the two conditions, or may satisfy only one of the two conditions.

When the tensile strength of the connection electrode CP is greater than about 400 MPa and the elastic modulus is less than about 50 GPa, the connection electrode CP may not be easily damaged. Therefore, one of the active layer ACT, the gate electrode GAT, and the conductive layer CDL which are under the connection electrode CP may be damaged earlier than the connection electrode CP, due to an external impact. Accordingly, a bright spot may be generated in the display device 10, and a defect rate of the display device 10 may be increased.

Thus, in one or more embodiment, the connection electrode CP may have a tensile strength of about 400 MPa or less or an elastic modulus of about 50 GPa or more. The connection electrode CP may satisfy both of the tensile strength condition (about 400 MPa or less) and the elastic modulus condition (about 50 GPa or more), or only one of the two conditions may be satisfied. As satisfying both conditions, the connection electrode CP may have the tensile strength of about 400 MPa together with the elastic modulus of about 50 GPa or more.

The connection electrode CP may have a shape of an electrode as well as a shape of a wire. The present disclosure is not limited thereto.

The second via insulating layer VIA2 may cover the connection electrode CP and may be disposed on the first via insulating layer VIAl. The first via insulating layer VIA1 and the second via insulating layer VIA2 may each include an organic insulating material. For example, the first via insulating layer VIA1 and the second via insulating layer VIA2 may include photoresist, polyacryl-based resin, polyimide-based resin, acryl-based resin, and the like. Accordingly, the first via insulating layer VIA1 and the second via insulating layer VIA2 may have a substantially flat upper surface. An upper surface of a component or layer may be a surface which is furthest from the substrate SUB, without being limited thereto.

The pixel electrode PXL may be disposed on the second via insulating layer VIA2. In one embodiment, the pixel electrode PXL may be connected to the connection electrode CP. The pixel electrode PXL may receive the driving current (or the initialization voltage VINT) from the connection electrode CP.

The pixel electrode PXL may include a reflective metal material or a transparent metal material. For example, the pixel electrode PXL may include silver (Ag), an alloy containing silver, molybdenum (Mo), an alloy containing molybdenum, aluminum (Al), an alloy containing aluminum, aluminum nitride (AlN), titanium (Ti), an alloy containing titanium, tungsten (W), tungsten nitride (WN), copper (Cu), nickel (Ni), chromium (Cr), chromium nitride (CrN), tantalum (Ta), platinum (Pt), scandium (Sc), indium tin oxide (ITO), indium zinc oxide (IZO), and the like. In addition, the pixel electrode PXL may have a multi-layer structure including Ag/ITO/Ag.

The pixel electrode PXL may include an edge at an end portion of the pixel electrode PXL. The pixel defining layer PDL may cover the end portion of the pixel electrode PXL and may extend along an end surface of the pixel electrode PXL to be disposed on the via insulating layer VIA. The pixel defining layer PDL may include an organic material. An opening exposing the pixel electrode PXL may be formed or provided in the pixel defining layer PDL. The opening in the pixel defining layer PDL may correspond to or define a light emission area at which light from a light emitting element is emitted.

The light emitting layer LEL may be disposed on the pixel electrode PXL. For example, the light emitting layer LEL may be disposed in the opening of the pixel defining layer PDL. The light emitting layer LEL may generate light based on the driving current. In addition, in order to increase the light emitting efficiency of the light emitting layer LEL, the light emitting layer LEL may include a functional layer (e.g., a hole injection layer, a hole transport layer, an electron transport layer, an electron injection layer, and the like). The common electrode CE may be disposed on the light emitting layer LEL. The common electrode CE may have a plate shape and receive the second power voltage ELVSS. The common electrode CE may include a reflective metal material or a transparent metal material. In an embodiment, the common electrode CE may extend across and be common to a plurality of pixels PX within the pixel unit PXP.

The pixel electrode PXL, the light emitting layer LEL, and the common electrode CE may together constitute a light emitting structure LES. The light emitting structure LES may correspond to the light emitting diode LED described with reference to FIG. 3, such as to represent a light emitting element which generates and/or emits light.

The first inorganic encapsulation layer IOL1 may be disposed on the common electrode CE. For example, the first inorganic encapsulation layer IOL1 may include an inorganic material. The organic encapsulation layer OL may be disposed on the first inorganic encapsulation layer TOLL For example, the organic encapsulation layer OL may include an organic material. Accordingly, the organic encapsulation layer OL may have a substantially flat upper surface. The second inorganic encapsulation layer IOL2 may be disposed on the organic encapsulation layer OL. For example, the second inorganic encapsulation layer IOL2 may include an inorganic material. The first inorganic encapsulation layer IOL1, the organic encapsulation layer OL, and the second inorganic encapsulation layer IOL2 may together constitute the encapsulation layer ECL. The encapsulation layer ECL may protect the light emitting structure LES from external impact and/or impurities.

In one embodiment, the connection electrode CP may have the tensile strength less than or equal to the tensile strength of the active layer ACT, or may have the elastic modulus greater than or equal to the elastic modulus of the active layer ACT, so that the connection electrode CP may have brittleness greater than that of the active layer ACT. Therefore, when the transistor (e.g., the second transistor T2 or the third transistor T3 of FIG. 3) is damaged due to external impact, the connection electrode CP may be damaged simultaneously with the active layer ACT included in the transistor, or the connection electrode CP may be damaged earlier than the active layer ACT.

When the display device 10 does not include the connection electrode CP having high brittleness, the driving current (or the initialization voltage VINT) is always applied to the driving transistor (e.g., the first transistor T1 of FIG. 3) when the transistor (e.g., the second transistor T2 or the third transistor T3 of FIG. 3) is damaged, and thus a bright spot may be generated in the display device 10.

However, when the display device 10 includes the connection electrode CP having high brittleness, the connection electrode CP connecting the drain electrode DE and the pixel electrode PXL may be damaged simultaneously with the active layer ACT or earlier than the active layer ACT. In other words, when the connection electrode CP is damaged, the driving current (or the initialization voltage VINT) may not be transmitted from the drain electrode DE to the pixel electrode PXL. Therefore, even when the transistor (e.g., the second transistor T2 or the third transistor T3 of FIG. 3) is damaged due to the external impact, a dark spot other than a bright spot, may be generated in the display device 10. Since the bright spot of the display device 10 is more visible to the eyes of the user than the dark spot, deterioration of the display quality of the display device 10 due to the external impact caused by the connection electrode CP may be prevented.

Figure 5:
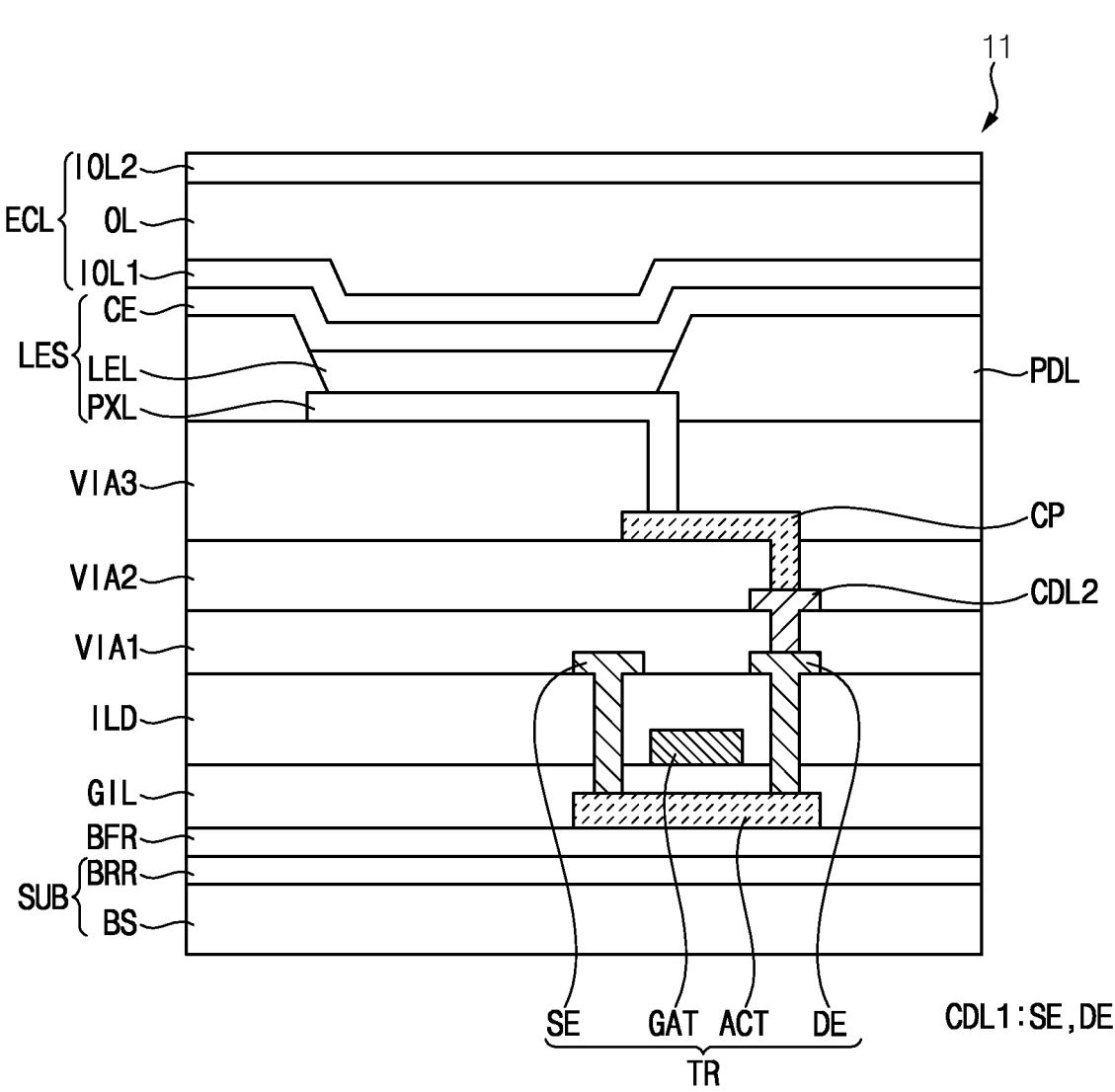
FIG. 5 is a cross-sectional view for describing a pixel unit included in the display device of FIG. 1.

FIG. 5 is a cross-sectional view for describing a pixel unit PXP included in a display device 11.

A display device 11 described with reference to FIG. 5 may be the same as the display device 10 described with reference to FIG. 4 except for a via insulating layer and a second conductive layer CDL2. Accordingly, a repeated description may be omitted or simplified.

Referring to FIG. 5, the pixel unit PXP included in the display device 11 may be disposed on a substrate SUB. The pixel unit PXP may include a substrate SUB, a buffer layer BFR, an active layer ACT, a gate insulating layer GIL, a gate electrode GAT, an interlayer insulating layer ILD, a first conductive layer CDL1, a via insulating layer, a connection electrode CP, a second conductive layer CDL2, a pixel electrode PXL, a pixel defining layer PDL, a light emitting layer LEL, a common electrode CE, a first inorganic encapsulation layer IOL1, an organic encapsulation layer OL, and a second inorganic encapsulation layer IOL2.

The first conductive layer CDL1 may be disposed on the interlayer insulating layer ILD. The first conductive layer CDL1 may include a source electrode SE and a drain electrode DE as a plurality of first conductive patterns. The source electrode SE and the drain electrode DE may be connected to the active layer ACT.

The via insulating layer may be disposed on the first conductive layer CDL1. The via insulating layer may include one or more of a first via insulating layer VIA1, a second via insulating layer VIA2, and a third via insulating layer VIA3. Each of the first via insulating layer VIA1, the second via insulating layer VIA2, and the third via insulating layer VIA3 may include an organic insulating material. Accordingly, each of the first via insulating layer VIA1, the second via insulating layer VIA2, and the third via insulating layer VIA3 may have a substantially flat upper surface.

The first via insulating layer VIA1 may cover the source electrode SE and the drain electrode DE, and may be disposed on the interlayer insulating layer ILD.

The second conductive layer CDL2 may be disposed on the first via insulating layer VIA1. The second conductive layer CDL2 may include one or more of a second conductive pattern which is connected to the drain electrode DE. The second conductive layer CDL2 may receive the driving current (or the initialization voltage VINT) from the drain electrode DE. The conductive layer CDL may include a metal, an alloy, a conductive metal oxide, a transparent conductive material, and the like. For example, the second conductive layer CDL2 may include the same material as the first conductive layer CDL1, but the present disclosure is not limited thereto.

The second via insulating layer VIA2 may cover the second conductive layer CDL2 and may be disposed on the first via insulating layer VIA1.

The connection electrode CP may be disposed on the second via insulating layer VIA2. The connection electrode CP may be connected to the second conductive layer CDL2. The connection electrode CP may be connected to the first conductive layer CDL1 via the second conductive layer CDL2. The connection electrode CP may receive the driving current (or the initialization voltage VINT) from the second conductive layer CDL2.

The connection electrode CP may have a tensile strength less than or equal to the tensile strength of the active layer ACT, or may have an elastic modulus greater than or equal to the elastic modulus of the active layer ACT. Alternatively, the connection electrode CP may have a tensile strength less than or equal to the tensile strength of the active layer ACT, together with an elastic modulus greater than or equal to the elastic modulus of the active layer ACT.

The third via insulating layer VIA3 may cover the connection electrode CP and may be disposed on the second via insulating layer VIA2.

The pixel electrode PXL may be disposed on the third via insulating layer VIA3. The pixel electrode PXL may be connected to the connection electrode CP. The pixel electrode PXL may receive the driving current (or the initialization voltage VINT) from the connection electrode CP. The light emitting element may be connected to the transistor TR via a multi-layer connection structure including the connection electrode CP and one or more of the first conductive layer CDL1 and the second conductive layer CDL2.

In some embodiments, even when at least one conductive layer (e.g., the second conductive layer CDL2) is disposed between the transistor TR including the first conductive layer CDL1 and the pixel electrode PXL, the pixel electrode PXL and the connection electrode CP may be connected to each other while coming into direct contact with each other.

In other words, the connection electrode CP may be disposed directly under the pixel electrode PXL, and may be disposed at the uppermost portion among the conductive layers (e.g., the first conductive layer CDL1, the second conductive layer CDL2, and the connection electrode CP) which are under the pixel electrode PXL. Therefore, the connection electrode CP is damaged simultaneously with or earlier than the active layer ACT due to external impact, so that the driving current (or the initialization voltage VINT) transmitted to the pixel electrode PXL may be blocked. Therefore, a dark spot other than a bright spot may be generated in the display device 11, and deterioration of display quality of the display device 11 due to the external impact may be prevented.

FIGS. 6 to 17 are views for describing a method for manufacturing or providing a display device 10 according to one embodiment of the present disclosure.

The method described with reference to FIGS. 6 to 17 may be the method for manufacturing the display device 10 of FIG. 4. Therefore, a repeated description may be omitted or simplified.

Figure 6:
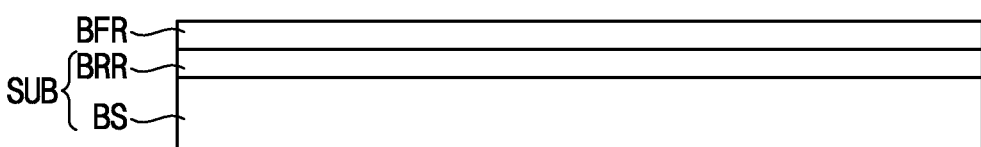
FIGS. 6 to 17 are views for describing a method for manufacturing (or providing) a display device according to an embodiment of the present disclosure.

Referring to FIG. 6, a substrate SUB may be formed or provided. Specifically, a base substrate BS may be formed. The base substrate BS may be formed of polyimide. A barrier layer BRR may be formed on the base substrate BS. The barrier layer BRR may be formed of an inorganic material. A buffer layer BFR may be formed on the barrier layer BRR.

Figure 7:
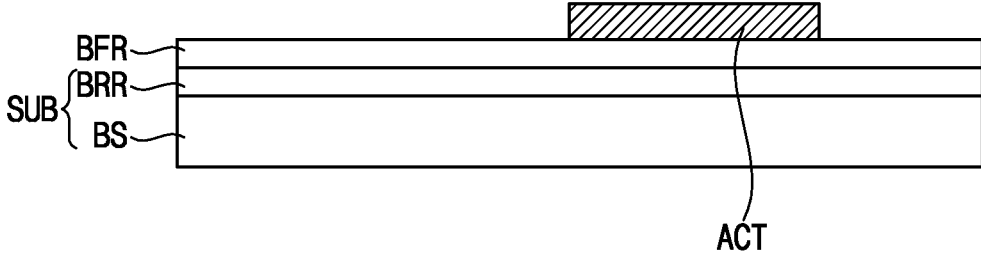

Referring to FIG. 7, an active layer ACT of a transistor TR may be formed on the buffer layer BFR. The active layer ACT may be formed of at least one selected from a silicon semiconductor, an oxide semiconductor, and an organic semiconductor. For example, the silicon semiconductor may include amorphous silicon, polycrystalline silicon, and the like.

Figure 8:
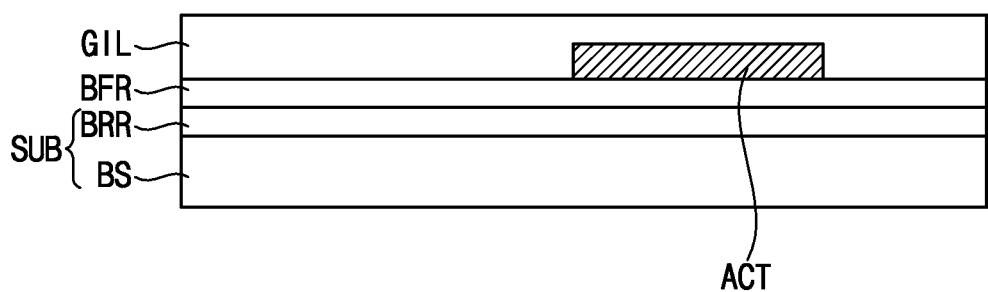

Referring to FIG. 8, a gate insulating layer GIL may be formed on the buffer layer BFR while covering the active layer ACT. The gate insulating layer GIL may be formed of an inorganic insulating material.

Figure 9:
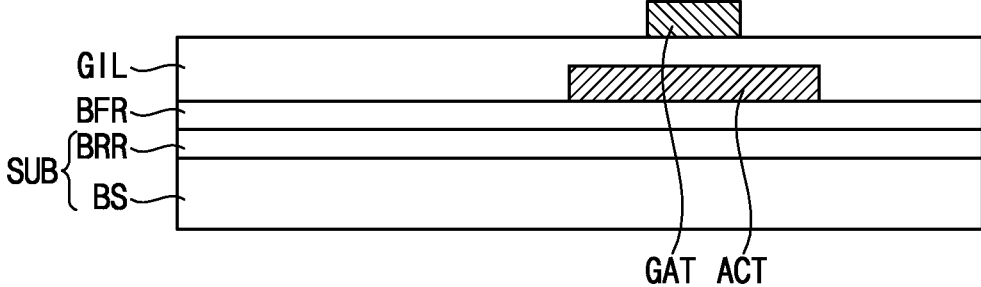

Referring to FIG. 9, a gate electrode GAT of a transistor TR may be formed on the gate insulating layer GIL. The gate electrode GAT may be formed to overlap or correspond to the active layer ACT. The gate electrode GAT may be formed of a metal, an alloy, a conductive metal oxide, and the like.

Figure 10:
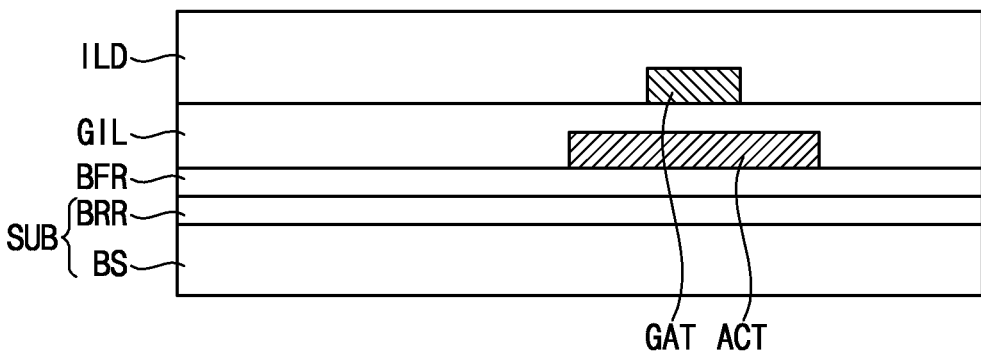

Referring to FIG. 10, an interlayer insulating layer ILD may be formed on the gate insulating layer GIL while covering the gate electrode GAT. The interlayer insulating layer ILD may be formed of an inorganic insulating material.

Figure 11:
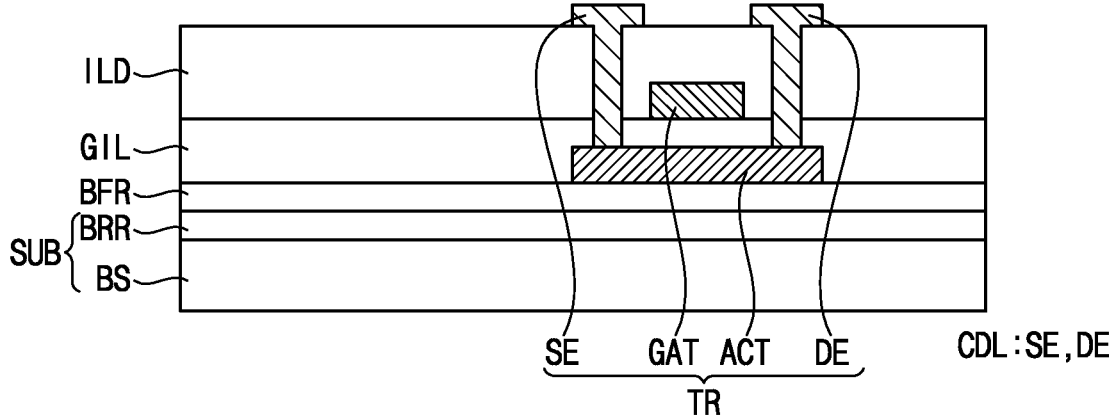

Referring to FIG. 11, a conductive layer CDL as a transistor conductive pattern may be formed on the interlayer insulating layer ILD. The conductive layer CDL may include a source electrode SE and a drain electrode DE of a transistor TR. The source electrode SE and the drain electrode DE may be connected to the active layer ACT through contact holes formed or defined in the interlayer insulating layer ILD and the gate insulating layer GIL. The conductive layer CDL may be formed of a metal, an alloy, a conductive metal oxide, a transparent conductive material, and the like.

The active layer ACT, the gate electrode GAT, and the conductive layer CDL may together form a transistor TR having a plurality of transistor conductive patterns (e.g., the gate electrode GAT, the source electrode SE and/or the drain electrode DE). One or more among the gate electrode GAT, the source electrode SE and the drain electrode DE may be a lower conductive layer or a lower conductive pattern of the transistor TR.

Figure 12:
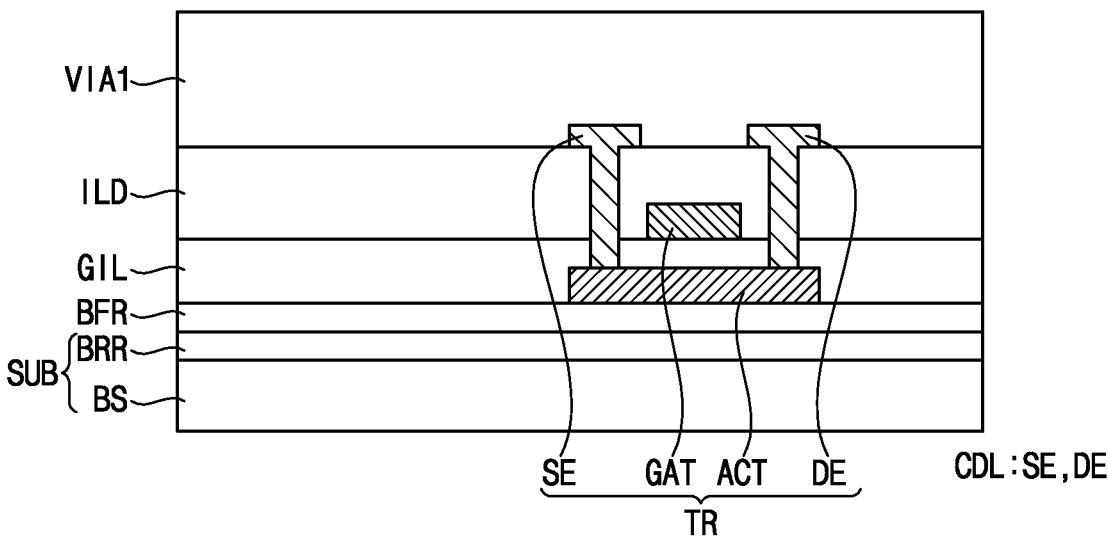

Referring to FIG. 12, a first via insulating layer VIA1 may be formed on the interlayer insulating layer ILD while covering the conductive layer CDL. The first via insulating layer VIA1 may be formed of an organic insulating material. For example, the first via insulating layer VIA1 may be formed of photoresist, polyacryl-based resin, polyimide-based resin, acryl-based resin, and the like.

Figure 13:
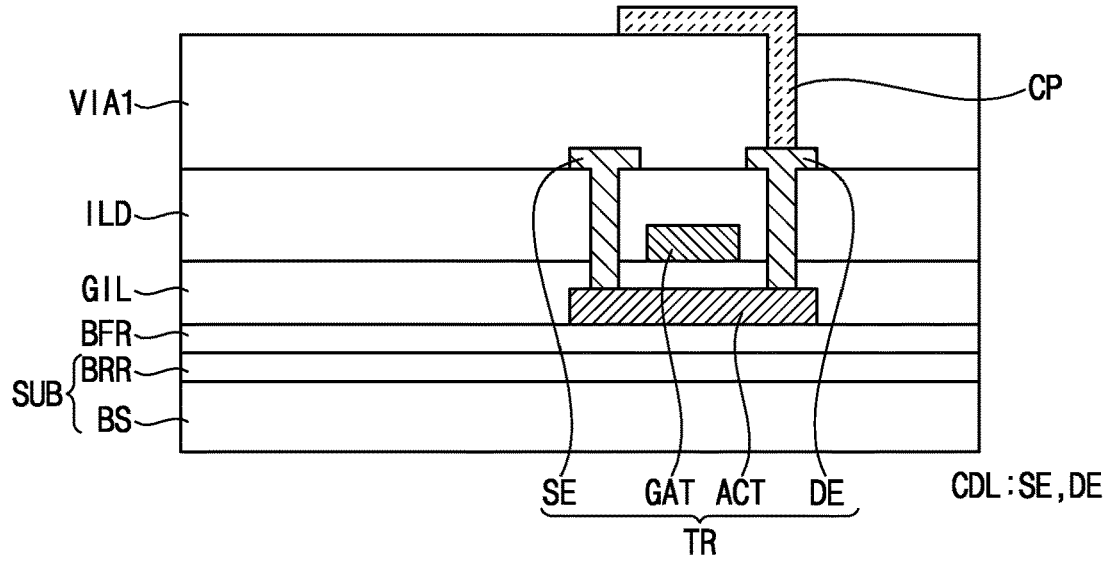

Referring to FIG. 13, a connection electrode CP may be formed on the first via insulating layer VIAL The connection electrode CP may be connected to the drain electrode DE through a contact hole formed in the first via insulating layer VIAL The connection electrode CP may define an upper conductive layer or an upper conductive pattern of the transistor TR.

The connection electrode CP may be formed of a metal, an alloy, and the like. For example, the connection electrode CP may be formed of a transparent conductive oxide (TCO). The transparent conductive oxide may be at least one selected from indium tin oxide (ITO), indium zinc oxide (IZO), indium gallium zinc oxide (IGZO), zinc oxide (ZnO), aluminum zinc oxide (AZO), and indium oxide (In2O3). The materials may be used alone or in combination.

For another example, the connection electrode CP may be formed of a material having a tensile strength less than or equal to the tensile strength of the active layer ACT. The connection electrode CP may have a tensile strength of about 400 MPa or less.

For another example, the connection electrode CP may be formed of a material having an elastic modulus greater than or equal to an elastic modulus of the active layer ACT. The connection electrode CP may have an elastic modulus of about 50 GPa or more.

Figure 14:
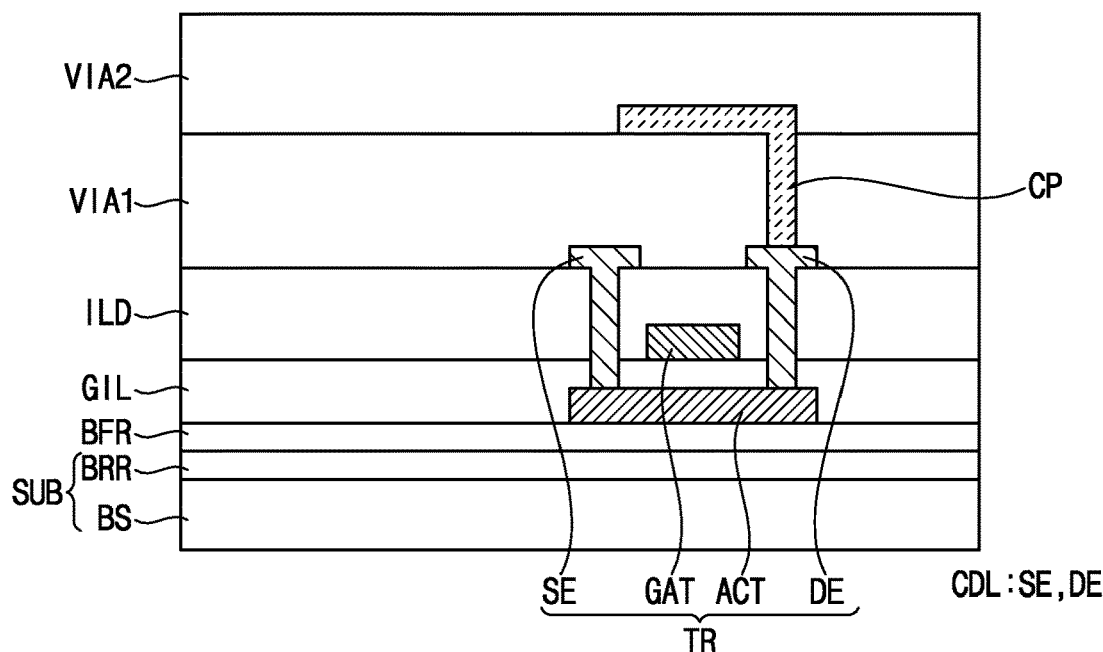

Referring to FIG. 14, a second via insulating layer VIA2 may be formed on the first via insulating layer VIA1 while covering the connection electrode CP. The second via insulating layer VIA2 may be formed of an organic insulating material. For example, the second via insulating layer VIA2 may be formed of photoresist, polyacryl-based resin, poly-imide-based resin, acryl-based resin, and the like.

Figure 15:
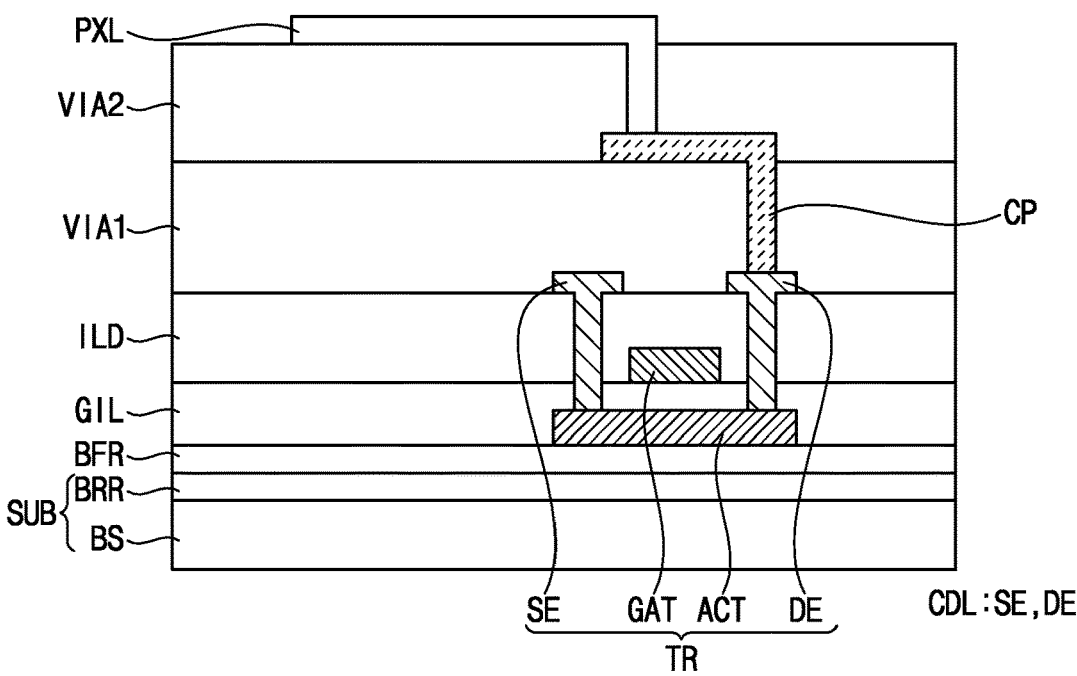

Referring to FIG. 15, a pixel electrode PXL of a light emitting element may be formed on the second via insulating layer VIA2. The pixel electrode PXL may be formed of a reflective metal material or a transparent metal material.

Figure 16:
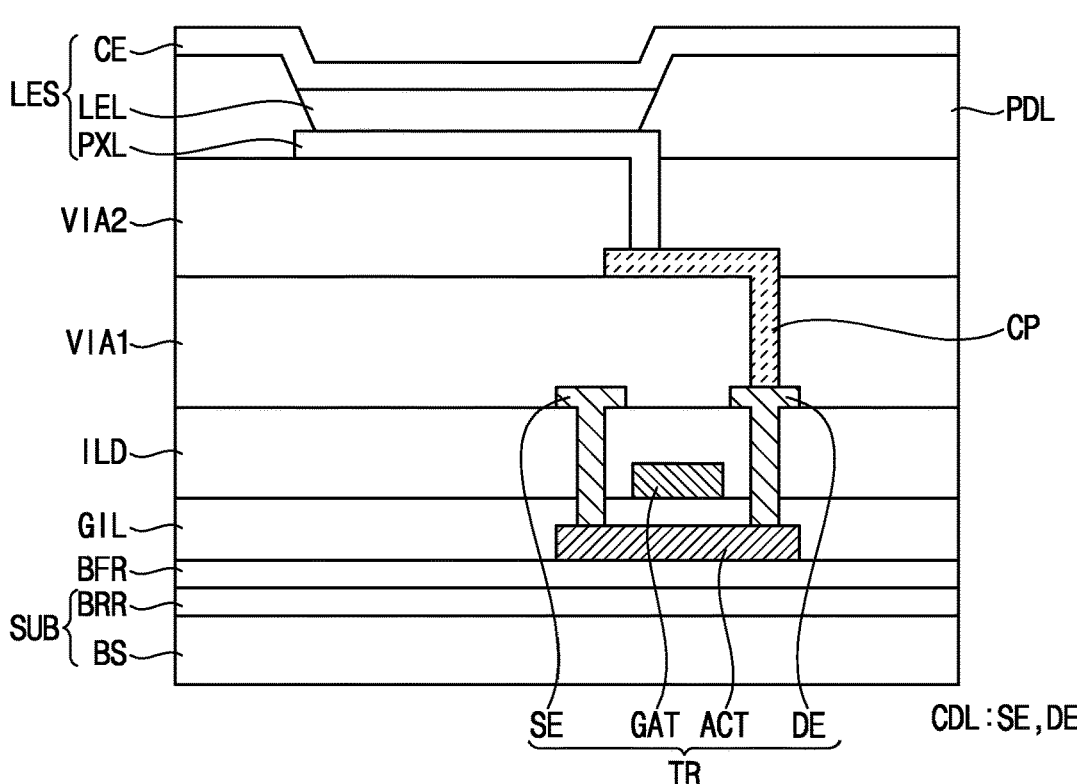

Referring to FIG. 16, a pixel defining layer PDL may be formed on the pixel electrode PXL. An opening exposing the pixel electrode PXL to outside the pixel defining layer PDL may be formed in the pixel defining layer PDL.

A light emitting layer LEL of the light emitting element may be formed on the pixel electrode PXL. The light emitting layer LEL may be formed in the opening. A common electrode CE of the light emitting element may be formed on the light emitting layer LEL. The common electrode CE may be formed of a reflective metal material or a transparent metal material.

The pixel electrode PXL, the light emitting layer LEL, and the common electrode CE may together form a light emitting structure LES. The pixel defining layer PDL may also define a portion of the light emitting structure LES, without being limited thereto.

Figure 17:
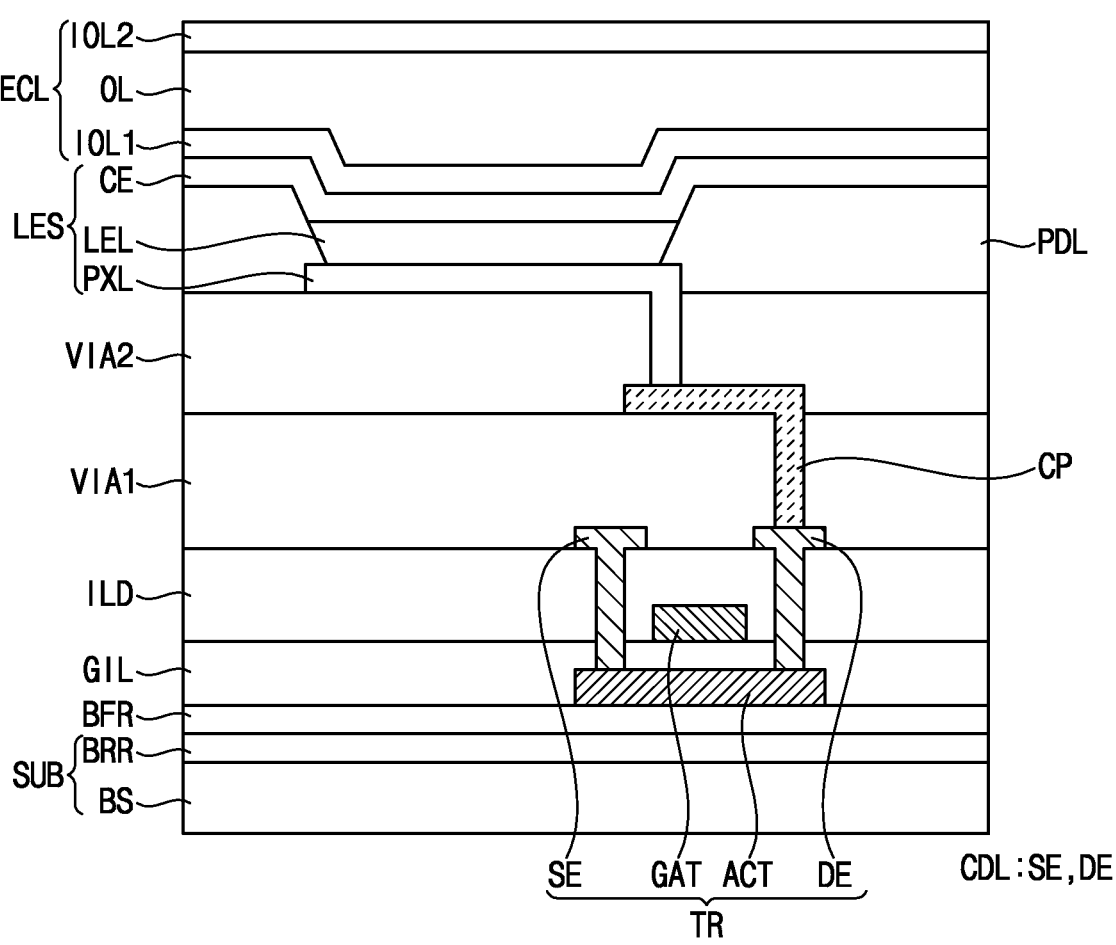

Referring to FIG. 17, a first inorganic encapsulation layer IOL1 may be formed on the common electrode CE. The first inorganic encapsulation layer IOL1 may be formed of an inorganic material. The organic encapsulation layer OL may be formed on the first inorganic encapsulation layer IOL1. The organic encapsulation layer OL may be formed of an organic material. The second inorganic encapsulation layer IOL2 may be formed on the organic encapsulation layer OL.

The second inorganic encapsulation layer IOL2 may be formed of an inorganic material.

The first inorganic encapsulation layer IOL1, the organic encapsulation layer OL, and the second inorganic encapsulation layer IOL2 may together form an encapsulation layer ECL.

The display device 10 (or the display device 11) according to embodiments may be applied to an electronic display device included in a computer, a laptop, a mobile phone, a smart phone, a smart pad, a vehicle, a portable multimedia player (PMP), a personal digital assistant (PDA), an MP3 player, and the like.

Although the above description has been made with reference to the embodiments of the present disclosure, it will be understood by those skilled in the art that the present disclosure may be variously modified and changed without departing from the idea and scope of the present disclosure described in the following claims.

What is claimed is:

1. A display device comprising:
a transistor including:
an active layer;
a gate electrode on the active layer; and
a conductive layer on the gate electrode and connected to the active layer;
a pixel electrode which is connected to the transistor; and
a connection electrode which connects the transistor to the pixel electrode and has a tensile strength less than a tensile strength of the transistor,
wherein among respective tensile strengths of the active layer, the gate electrode and the conductive layer of the transistor, the tensile strength of the connection electrode is less than or equal to the tensile strength of the active layer.

2. The display device of claim 1, wherein the active layer includes at least one selected from a silicon semiconductor, an oxide semiconductor and an organic semiconductor.

3. The display device of claim 1, wherein the connection electrode has the tensile strength of about 400 megapascals or less.

4. The display device of claim 1, wherein the connection electrode has an elastic modulus which is greater than or equal to an elastic modulus of the active layer.

5. The display device of claim 4, wherein the connection electrode has the elastic modulus of about 50 gigapascals or more.

6. The display device of claim 1, wherein the connection electrode has the tensile strength which is less than or equal to a tensile strength of the gate electrode.

7. The display device of claim 1, wherein the connection electrode has the tensile strength which is less than or equal to a tensile strength of the conductive layer.

8. The display device of claim 1, wherein the connection electrode includes a transparent conductive oxide.

9. The display device of claim 8, wherein the transparent conductive oxide includes at least one selected from indium tin oxide, indium zinc oxide, indium gallium zinc oxide, zinc oxide, aluminum zinc oxide, and indium oxide.

10. The display device of claim 1, further comprising a polyimide substrate,
wherein the active layer, the conductive layer, the connection electrode and the pixel electrode are in order from the substrate, along a thickness direction of the substrate.

11. The display device of claim 1, wherein the connection electrode is connected to the transistor at the conductive layer.

12. The display device of claim 1, further comprising a light emitting element including the pixel electrode,
wherein the connection electrode is connected to the light emitting element, at the pixel electrode.

13. The display device of claim 12, wherein the light emitting element further includes a light emitting layer and a common electrode.

14. A display device comprising:
a transistor including:
an active layer;
a gate electrode on the active layer; and
a conductive layer on the gate electrode and connected to the active layer;
a pixel electrode which is connected to the transistor; and
a connection electrode which connects the transistor to the pixel electrode and has an elastic modulus greater than or equal to an elastic modulus of the transistor,
wherein among respective elastic modulii of the active layer, the gate electrode and the conductive layer, the elastic modulus of the connection electrode is greater than or equal to the elastic modulus of the active layer.

15. The display device of claim 14, wherein the active layer includes at least one selected from a silicon semiconductor, an oxide semiconductor, and an organic semiconductor.

16. The display device of claim 14, wherein the connection electrode has the elastic modulus of about 50 gigapascals or more.

17. The display device of claim 14, wherein the connection electrode has a tensile strength which is less than or equal to a tensile strength of the active layer.

18. The display device of claim 17, wherein the connection electrode has the tensile strength of about 400 megapascals or less.

19. The display device of claim 14, wherein the connection electrode has the elastic modulus which is greater than or equal to an elastic modulus of the gate electrode.

20. The display device of claim 14, wherein the connection electrode has the elastic modulus which is greater than or equal to an elastic modulus of the conductive layer.

* * * * *